United States Patent [19]

Ackley et al.

[11] Patent Number: 5,164,949
[45] Date of Patent: Nov. 17, 1992

[54] VERTICAL CAVITY SURFACE EMITTING LASER WITH LATERAL INJECTION

[75] Inventors: Donald E. Ackley, Paradise Valley; Paige M. Holm, Phoenix, both of Ariz.

[73] Assignee: Motorola, Inc., Schaumburg, Ill.

[21] Appl. No.: 756,695

[22] Filed: Sep. 9, 1991

[51] Int. Cl.⁵ .............................................. H01S 3/19
[52] U.S. Cl. ...................................... 372/45; 372/46; 372/96
[58] Field of Search ........................ 372/45, 46, 50, 96

[56] References Cited

U.S. PATENT DOCUMENTS

| | | | |
|---|---|---|---|
| 4,949,350 | 8/1990 | Jewell et al. | 372/45 |
| 5,020,066 | 5/1991 | Iga et al. | 372/45 |
| 5,031,187 | 7/1991 | Orenstein et al. | 372/50 |
| 5,034,958 | 7/1991 | Kwon et al. | 372/45 |
| 5,038,356 | 8/1991 | Botez et al. | 372/45 |
| 5,052,008 | 9/1991 | Kemeny | 372/96 |
| 5,086,430 | 2/1992 | Kapon et al. | 372/45 |
| 5,088,099 | 2/1992 | Chen et al. | 372/96 |

FOREIGN PATENT DOCUMENTS

| | | | |
|---|---|---|---|
| 0199085 | 9/1987 | Japan | 372/96 |
| 0021090 | 1/1991 | Japan | 372/46 |
| 0021091 | 1/1991 | Japan | 372/46 |

OTHER PUBLICATIONS

Zou et al., "Ultralow Threshold Strained InGaAs-GaAs Quantum Well Lasers By Impurity-Induced Disordering", Electronics Letters, Jul. 4, 1991, vol. 27, No. 14, pp. 1241-1243.

Hasnain et al., "Continuous Wave Top Surface Emitting Quantum Well Lasers Using Hybrid Metal Semiconductor Reflectors," Electronics Letters, Sep. 13, 1990, vol. 26, No. 19, pp. 1590-1591.

Jewell et al., "Vertical Cavity Single Quantum Well Laser," Appl. Phys. Lett., vol. 55 (5) Jul. 1989, pp. 424-426.

Geels et al., "Low Threshold Planarized Vertical-Cavity Surface-Emitting Lasers," IEE Photonics Technology Letters, vol. 2, No. 4, Apr. 1990, pp. 234-236.

Primary Examiner—Georgia Y. Epps
Attorney, Agent, or Firm—Miriam Jackson

[57] ABSTRACT

A planar semiconductor laser having low thermal and series resistance is fabricated. The semiconductor laser has an optical waveguide and a lateral current injection path provided by a conductive region. The conductive region disorders the active region and the first ¼ wave stack of the laser, which reduces the reflectivity, therefore allowing control of the optical waveguide independent of the current flow. By forming the conductive region, the laser of the present invention can have stable optical characteristics and a bigger emission spot due to the weak built-in waveguide, thus resulting in the formation of a device having high output and a low thermal and series resistance.

22 Claims, 2 Drawing Sheets

VERTICAL CAVITY SURFACE EMITTING LASER WITH LATERAL INJECTION

BACKGROUND OF THE INVENTION

This invention relates, in general, to semiconductor lasers, including, but not limited to, vertical cavity surface emitting lasers (VCSELs).

Semiconductor lasers are important for use as optical devices. In the past, edge emitting devices, in which the output light is emitted parallel to the semiconductor substrate, have been fabricated. However, vertical cavity devices, in which the output light is emitted perpendicular to the semiconductor substrate, are much more advantageous in certain applications. Vertical cavity devices have advantages such as high two-dimensional packing density for arrays and integrated circuits, wafer scale testing ability, and can be readily integrated with other devices. Although much research and improvement has been done on VCSELs, there is still a need to fabricate more efficient lateral injection VCSELs for optical interconnect applications and displays.

A VCSEL used in the past is a mesa-etched device. These mesa-etched VCSELs are limited to small spot sizes, resulting in devices having low output power and high series and thermal resistances. Therefore, there is a need to form more efficient VCSELs with high power output and low series and thermal resistances. Another disadvantage of mesa-etched devices is that they are highly non-planar and it is difficult to take the light output out of the top of the device. Planar structures are desirable from a process and packaging point of view.

A way of fabricating planar VCSELs has been disclosed by Hasnain et al, in Electronics Letters, Vol. 26, No. 19, pp. 1590-91, published on Sep. 13, 1990. These VCSELs are proton bombarded to provide for lateral current confinement. These devices, however, have potential problems with reliability and with thermal waveguiding. Thermal waveguiding is disadvantageous because the optical properties of the device can change when the device heats up. In addition, the output beam of these devices is not diffraction limited due to the fact that waveguiding is provided only by the injected current distribution and the junction temperature distribution.

SUMMARY OF THE INVENTION

In accordance with the present invention a semiconductor laser and method of manufacture is disclosed. The semiconductor laser is comprised of a supporting structure, including a substrate of a first conductivity type, a first ¼ wave stack of the first conductivity type formed on the supporting structure, an active layer formed on the first ¼ wave stack, a spreading layer of a second conductivity type formed on the active layer, a region of the second conductivity type formed in a portion of the spreading layer, the active layer and the first ¼ wave stack, and a second ¼ wave stack formed on a portion of the spreading layer.

DETAILED DESCRIPTION OF THE DRAWINGS

Figure 1:
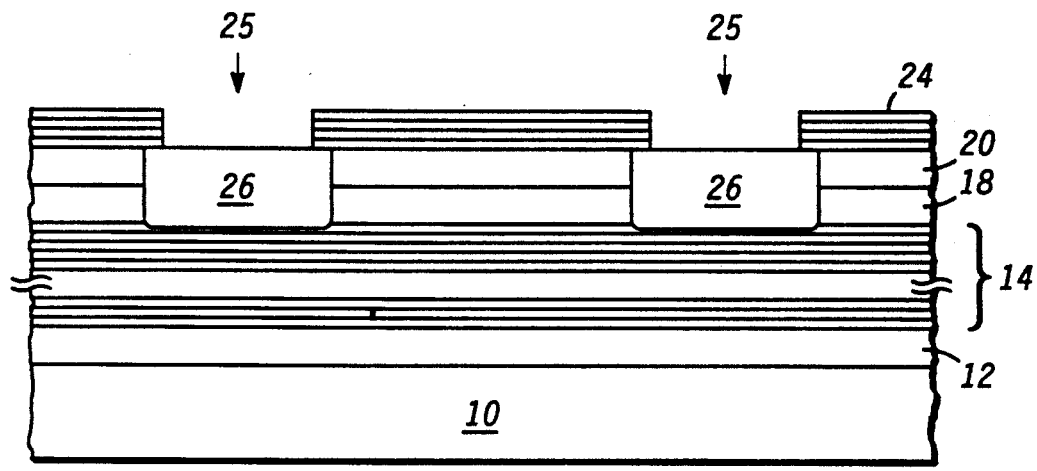
FIG. 1 illustrates an enlarged, cross-sectional view of a first embodiment of the present invention in a beginning stage of fabrication.

FIG. 1 illustrates an enlarged, cross-sectional view (not drawn to scale) of a first embodiment of the present invention in a beginning stage of fabrication. What is shown is a VCSEL comprised of a supporting structure 10 of a first conductivity type. In a preferred embodiment, supporting structure 10 is comprised of a p-type substrate. The use of a p-type substrate has two beneficial effects. A more uniform lateral current injection is obtained because an n-type spreading layer 20 (described below) may be used. In addition, reduced series resistance is obtained due to the absence of current confinement in the p-type substrate and the p-type ¼ wave stack 14 (described below). In a preferred embodiment, supporting structure 10 is comprised of gallium arsenide and is doped p-type at approximately $5 \times 10^{18}$ atoms/cm$^3$ with a p-type dopant such as zinc. Other suitable dopants may be used. Supporting structure 10 and subsequent epitaxial layers may be comprised of other III-V semiconductor materials systems such as indium phosphide.

Formed on supporting structure 10 is a buffer layer 12 of the first conductivity type. In a preferred embodiment, buffer layer 12 is comprised of a p-type gallium arsenide epitaxial layer. Buffer layer 12 is not absolutely necessary to obtain a working device, however, buffer layer 12 may be used to obtain better epitaxial growth of subsequent layers.

Next, a first ¼ wave stack 14 is formed on buffer layer 12. First ¼ wave stack 14 is also referred to as a mirror stack or distributed Bragg reflector in the art. A VCSEL is typically fabricated to operate at a particular wavelength, called the lasing wavelength or wavelength of operation. The material used in the first ¼ wave stack 14 must be transparent at the lasing wavelength. In a preferred embodiment, first ¼ wave stack 14 is comprised of alternating layers of p-type aluminum arsenide (AlAs) and gallium arsenide (GaAs). In addition, the thickness of each layer is preferably equal to ¼ of the wavelength of operation divided by the refractive index. The number of periods or pairs of alternating layers determines the reflectivity of the device. Typically, the number of periods will be equal to 25 to 30.

Subsequently, an active layer 18 is formed on first ¼ wave stack 14. Active layer 18 is preferably comprised of barrier layers and at least one quantum well which is comprised of nominally undoped indium gallium arsenide (InGaAs). However, multiple quantum wells may be used. In addition, other materials, such as gallium arsenide, may be used for different operating wavelengths, with appropriate changes to the composition of first ¼ wave stack 14 to maintain transparency. The formation of quantum well active layers and barriers is well known in the art. The total thickness of active layer 18 must be a multiple of ½ of the wavelength of operation in order for active layer 18 to fulfill phase matching requirements in the optical cavity, which is comprised of all the layers between first ¼ wave stack 14 and second ¼ wave stack 24 (described below).

A spreading layer 20 of a second conductivity type is then formed on active layer 21. Spreading layer 20 must be formed from a material transparent at the lasing wavelength. In order to fulfill the phase matching requirements imposed by the optical cavity, spreading layer 20 should be of a thickness equal to any ½ wave multiple of the lasing wavelength. In addition, spreading layer 20 is preferably comprised of a high bandgap material. In a preferred embodiment, spreading layer 20 is comprised of n-type aluminum gallium arsenide (AlGaAs). The high mobility and diffusion constant of n-type aluminum gallium arsenide leads to a more uniform lateral injection.

Thereafter, a second ¼ wave stack 24 is formed on spreading layer 20 and subsequently patterned to provide an opening 25. Opening 25 is formed by using standard photolithography and etch techniques. Second ¼ wave stack 24 may be formed by, for example, plasma chemical vapor deposition, electron beam evaporation, or sputtering. In a preferred embodiment, second ¼ wave stack 24 is a dielectric mirror stack which is comprised of alternating silicon and silicon dioxide layers, where the silicon is undoped amorphous silicon. However, other dielectric layers such as silicon nitride or alumina ($Al_2O_3$) may be used. The formation of dielectric stacks is well known in the art.

After the formation of opening 25, a dopant of the second conductivity type is introduced into opening 25 to form a conductive region 26. In a preferred embodiment, silicon is ion implanted or deposited and then diffused to form conductive region 26. Other suitable dopants of the second conductivity type may also be used, such as sulfur. It is desirable for conductive region 26 to be formed to extend from the surface of spreading layer 20 down into at least a portion of first ¼ wave stack 14. The concentration of the dopant introduced must be high enough to form a P-N junction in first ¼ wave stack 14. In the present invention, the introduction of the dopant of the second conductivity type forms a conductive region, not a resistive region, such as is formed by using protons in the prior art. The dopant of the second conductivity type causes the disordering of active layer 21 and of the boundaries of first ¼ wave stack 14. This disordering reduces the reflectivity, therefore allowing control of the optical waveguide independent of the current flow. Conductive region 26 provides for lateral current injection into spreading layer 20, and acts as a waveguide. Etching of the second ¼ wave stack also reduces the reflectivity outside of the waveguide region. In addition, current confinement is provided by the high turn-on voltage of the blocking junctions beneath conductive region 26. By forming conductive region 26, the VCSEL of the present invention can have stable optical characteristics and a bigger emission spot due to the weak built-in waveguide, thus resulting in the formation of a device having high output and a low thermal and series resistance. The shallow junction of conductive region 26 provides for low thermal resistance.

Figure 2:
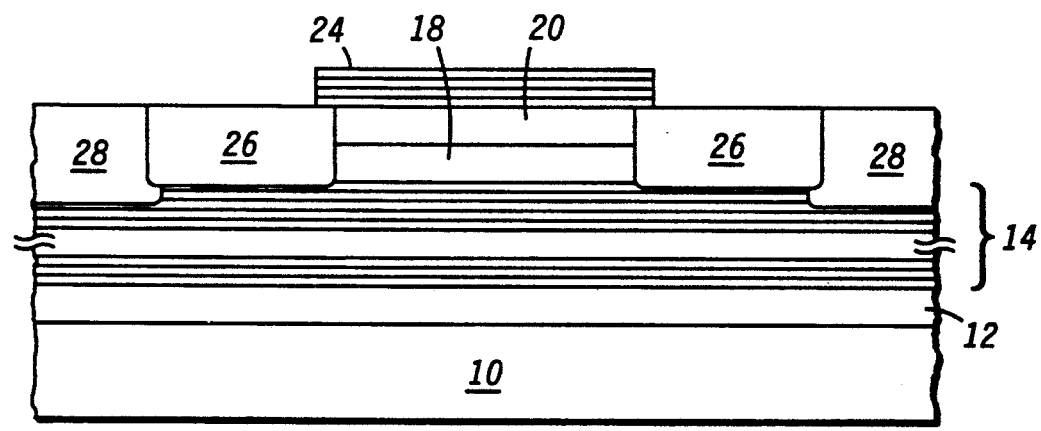
FIG. 2 illustrates the first embodiment of the present invention in a further stage of fabrication.

FIG. 2 illustrates the structure of FIG. 1 further along in processing. First, a portion of second ¼ wave stack 24 is removed. An isolation region 28 is formed adjacent to conductive region 26. In a preferred embodiment, oxygen is implanted to form isolation region 28. However, other isolation techniques such as trench isolation may be used.

Figure 3:
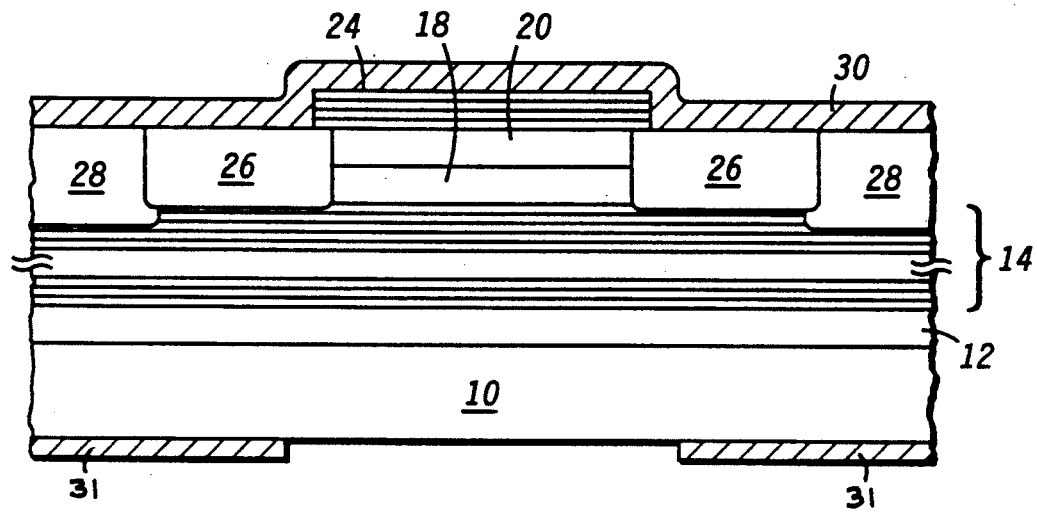
FIG. 3 illustrates the first embodiment of the present invention in a later stage of fabrication.

FIG. 3 illustrates the structure of FIG. 2 further along in processing. A second conductivity type ohmic contact 30 is formed over second ¼ wave stack 24, on conductive region 26, and isolation region 28. In this embodiment, a substrate-emitting device is formed, where the output is emitted through the backside of supporting structure 10. A first conductivity type ohmic contact 31 is formed on the backside of supporting structure 10. A portion of ohmic contact 31 is subsequently etched so that the output may be emitted through supporting structure 10. The fabrication and use of first and second conductivity type ohmic contacts, in general, is well known in the art.

Figure 4:
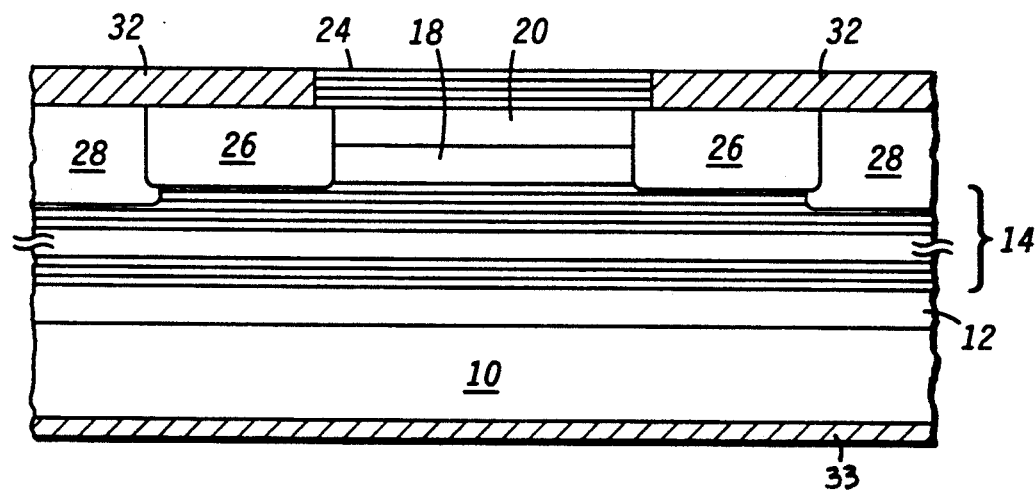
FIG. 4 illustrates a second embodiment of the present invention in a later stage of fabrication.

FIG. 4 illustrates a second embodiment of the present invention and the structure of FIG. 2 further along in processing. FIG. 4 illustrates an embodiment of a top-emitting device where the output is emitted through second ¼ wave stack 24. In this embodiment, a second conductivity type ohmic contact 32 is formed on conductive region 26 and on isolation region 28 only. A first conductivity type ohmic contact 33 is formed on the backside of supporting structure 10.

As can be readily seen, the VCSEL of the present invention has an optical waveguide and a lateral current injection path provided by the conductive region. The lateral optical waveguide is formed by the following two effects. The conductive region introduces disordering of the first ¼ wave stack and the active layer which reduces the mirror reflectivity. Etching of the second ¼ wave stack also reduces the reflectivity outside of the waveguide region. In addition, in a preferred embodiment, the use of a p-type substrate leads to more uniform lateral injection because an n-type spreading layer 20 may be used, which has a higher mobility and diffusion constant than p-type material. However, a device with layers/regions of the opposite conductivity type shown may also be used successfully. Furthermore, the device is easy to fabricate, and is substantially planar for simplified interconnections and packaging.

We claim:

1. A semiconductor laser, operating at a particular wavelength, comprising:
    a supporting structure, including a substrate of a first conductivity type;
    a first ¼ wave stack of the first conductivity type formed on the supporting structure;
    an active layer having a thickness of a multiple of ½ of the particular wavelength of operation formed on the first ¼ wave stack;
    a spreading layer of a second conductivity type having a thickness of a multiple of ½ of the particular wavelength of operation formed on the active layer;
    a region of the second conductivity type formed in a portion of the spreading layer, the active layer and the first ¼ wave stack; and
    a second ¼ wave stack formed on a portion of the spreading layer.

2. The semiconductor laser of claim 1 wherein the substrate is p-type.

3. The semiconductor laser of claim 1 wherein the substrate is comprised of p-type gallium arsenide, the first ¼ wave stack is comprised of p-type aluminum arsenide/gallium arsenide, the active layer is comprised of at least one quantum well, and the spreading layer is comprised of an n-type aluminum gallium arsenide.

4. The semiconductor laser of claim 1 wherein the second ¼ wave stack is a dielectric mirror stack comprised of silicon and silicon dioxide.

5. The semiconductor laser of claim 1 further comprising a buffer layer formed between the supporting structure and the first ¼ wave stack.

6. The semiconductor laser of claim 1 wherein the region of the second conductivity type is doped with silicon.

7. The semiconductor laser of claim 1 further comprising:
a second conductivity type ohmic contact formed on the second ¼ wave stack and on the spreading layer over the region of the second conductivity type; and
a first conductivity type ohmic contact formed on a portion of the supporting structure.

8. The semiconductor laser of claim 1 further comprising:
a second conductivity type ohmic contact formed on the spreading layer over the region of the second conductivity type; and
a first conductivity type ohmic contact formed on the supporting structure.

9. A semiconductor laser, operating at a particular wavelength, comprising:
a substrate of a first conductivity type;
a first ¼ wave stack of the first conductivity type formed on the substrate;
an active layer having a thickness of a multiple of ½ of the particular wavelength of operation formed on the first ¼ wave stack, the active layer being comprised of at least one quantum well;
a spreading layer of a second conductivity type having a thickness of a ½ wave multiple of the particular wavelength formed on the active layer;
a conductive region of the second conductivity type formed in a portion of the spreading layer, the active layer and the first ¼ wave stack; and
a second ¼ wave stack formed on a portion of the spreading layer.

10. The semiconductor laser of claim 9 wherein the substrate is p-type.

11. The semiconductor laser of claim 9 wherein the substrate is comprised of p-type gallium arsenide, the first ¼ wave stack is comprised of p-type aluminum arsenide/gallium arsenide, the active layer is comprised of indium gallium arsenide, and the spreading layer is comprised of an n-type aluminum gallium arsenide.

12. The semiconductor laser of claim 9 wherein the second ¼ wave stack is a dielectric mirror stack comprised of silicon and silicon dioxide.

13. The semiconductor laser of claim 9 further comprising a buffer layer formed between the substrate and the first ¼ wave stack.

14. The semiconductor laser of claim 9 wherein the conductive region of the second conductivity type is doped with silicon.

15. The semiconductor laser of claim 9 further comprising:
a second conductivity type ohmic contact formed on the second ¼ wave stack and on the spreading layer over the conductive region of the second conductivity type; and
a first conductivity type ohmic contact formed on a portion of the substrate.

16. The semiconductor laser of claim 9 further comprising:
a second conductivity type ohmic contact formed on the spreading layer over the region of the second conductivity type; and
a first conductivity type ohmic contact formed on the substrate.

17. A vertical cavity surface emitting semiconductor laser, operating at a particular wavelength, comprising:
a supporting structure, including a p-type gallium arsenide substrate;
a p-type aluminum arsenide/gallium arsenide ¼ wave stack formed on the supporting structure;
an active layer formed on the aluminum arsenide/gallium arsenide ¼ wave stack comprised of at least one indium gallium arsenide quantum well, wherein the active layer is of a thickness of a multiple of ½ of the particular wavelength of operation;
an n-type aluminum gallium arsenide spreading layer formed on the active layer;
a silicon doped region formed in a portion of the aluminum gallium arsenide spreading layer, the active layer and the aluminum arsenide/gallium arsenide ¼ wave stack to provide lateral current injection and waveguiding; and
a dielectric mirror stack formed on a portion of the aluminum gallium arsenide spreading layer.

18. The vertical cavity surface emitting semiconductor laser of claim 17 wherein the dielectric mirror stack is comprised of silicon and silicon dioxide.

19. The vertical cavity surface emitting semiconductor laser of claim 17 further comprising a buffer layer formed between the supporting structure and the p-type aluminum arsenide/gallium arsenide first ¼ wave stack.

20. The vertical cavity surface emitting semiconductor laser of claim 17 further comprising:
a second conductivity type ohmic contact formed over the dielectric stack and on the n-type aluminum gallium arsenide spreading layer over the silicon region; and
a first conductivity type ohmic contact formed on a portion of the supporting structure.

21. The vertical cavity surface emitting semiconductor laser of claim 17 further comprising:
a second conductivity type ohmic contact formed on the n-type aluminum gallium arsenide spreading layer over the silicon region; and
a first conductivity type ohmic contact formed on the supporting structure.

22. A method of fabricating a semiconductor laser, operating at a particular wavelength, comprising the steps of:
providing a supporting structure, including a substrate of a first conductivity type;
forming a first ¼ wave stack of the first conductivity type on the supporting structure;
forming an active layer having a thickness of a multiple of ½ of the particular wavelength of operation on the first ¼ wave stack;
forming a spreading layer of a second conductivity type on the active layer;
forming a region of the second conductivity type in a portion of the spreading layer, the active layer and the first ¼ wave stack; and
forming a second ¼ wave stack on a portion of the spreading layer.

* * * * *